(12) United States Patent
Miller et al.

(10) Patent No.: US 7,759,923 B2
(45) Date of Patent: Jul. 20, 2010

(54) CURRENT SENSING IN A BUCK-BOOST SWITCHING REGULATOR USING INTEGRALLY EMBEDDED PMOS DEVICES

(75) Inventors: Ira G. Miller, Tempe, AZ (US); Eduardo Velarde, Chandler, AZ (US)

(73) Assignee: Micrel, Inc., San Jose, CA (US)

( * ) Notice: Subject to any disclaimer, the term of this patent is extended or adjusted under 35 U.S.C. 154(b) by 244 days.

(21) Appl. No.: 12/169,485

(22) Filed: Jul. 8, 2008

(65) Prior Publication Data
US 2010/0007316 A1  Jan. 14, 2010

(51) Int. Cl.
  G05F 1/40 (2006.01)
  G05F 1/56 (2006.01)
(52) U.S. Cl. .................... 323/285; 323/282
(58) Field of Classification Search .............. 323/268, 323/271, 282, 285; 257/330–332, 340, 341, 257/343, 401, 491, 496
  See application file for complete search history.

(56) References Cited

U.S. PATENT DOCUMENTS

| | | | |
|---|---|---|---|
| 4,553,084 A * | 11/1985 | Wrathall | 323/316 |
| 5,517,046 A | 5/1996 | Hsing et al. | |
| 6,011,385 A * | 1/2000 | Brandt et al. | 323/280 |
| 6,175,224 B1 * | 1/2001 | Kadanka | 323/281 |
| 6,646,426 B2 * | 11/2003 | Terashi | 323/285 |
| 6,818,950 B1 * | 11/2004 | Mallikarjunaswamy | 257/340 |
| 2005/0206359 A1 * | 9/2005 | Daniels et al. | 323/282 |

* cited by examiner

*Primary Examiner*—Matthew V Nguyen
(74) *Attorney, Agent, or Firm*—Patent Law Group LLP; Carmen C. Cook

(57) ABSTRACT

A current sense device for a power transistor is described. The power transistor is formed in a cellular structure including a cellular array of transistor cells. The current sense device includes multiple transistor cells in the cellular array of transistor cells of the power transistor being used as sense transistor cells. The sense transistor cells are evenly distributed throughout the cellular array where the source terminal of each sense transistor cell is electrically connected to a first node through a metal line in the first metal layer and through a metal line in the second metal layer where the metal lines are electrically isolated from the metal lines connecting the transistor cells of the power transistor. The sense transistor cells measure a small portion of the current flowing through the power transistor based on the size ratio of the current sense device and the power transistor.

10 Claims, 10 Drawing Sheets

CURRENT SENSING IN A BUCK-BOOST SWITCHING REGULATOR USING INTEGRALLY EMBEDDED PMOS DEVICES

FIELD OF THE INVENTION

The invention relates to current sensing in a switching regulator and, in particular, to current sensing in a buck-boost switching using integrally embedded PMOS devices.

DESCRIPTION OF THE RELATED ART

A typical battery operated device, such as a camera, a music player, or other device, may have an operating voltage of, for example, 3.3 volts. The battery used for the device may have a fully charged voltage of, for example, 4.7 volts and eventually discharges down to 2.7 volts over time. A voltage regulator internal to the device regulates the battery voltage to provide a constant operating voltage of 3.3 volts in this example.

DC voltage regulators or switching regulators operate to convert energy from one DC voltage level to another DC voltage level. A switching regulator, sometimes referred to as a switching mode power supply, provides power supply function through low loss components such as capacitors, inductors, and transformers, and power switches that are turned on and off to transfer energy from the input to the output in discrete packets. A feedback control circuit is used to regulate the energy transfer to maintain a constant output voltage within the desired load limits of the circuit.

A switching regulator can be configured to step up the input voltage or step down the input voltage or both. Specifically, a buck switching regulator, also called a "buck converter," steps down the input voltage while a boost switching regulator, also called a "boost converter," steps up the input voltage. A buck-boost switching regulator, or buck-boost converter, provides both step-up and step-down functions.

The operation of the switching regulator is well known and is generalized as follows. A power switch is turned on to apply energy to an inductor to allow the current through the inductor to build up. When the power switch is turned off, the voltage across the inductor reverses and charges are transferred onto an output capacitor and the load. A relatively constant output voltage is maintained by the output capacitor.

In general, switching regulators are operated in two modes. In the discontinuous mode, the inductor current builds up from zero during the power switch "on" time. During the power switch "off" time, the energy in the inductor is completely transferred to the output capacitor and output load. In the continuous mode, the inductor current during the power switch "off" time does not decay to zero. Rather, the power switch turns on to deliver energy to the inductor so that the current into the inductor is continuous, never going to zero.

A common regulating technique for a switching regulator is pulse width modulation (PWM), where the power switches are turned on and off at a fixed frequency, but at an adjusted duty cycle, so that the average current equals the load current at the desired regulated voltage. Some PWM regulators use a variable switching frequency control instead of a fixed frequency control.

In a combined buck-boost regulator that either steps down or steps up the battery voltage, the input voltage is compared to the output voltage to determine whether to enter the buck mode or boost mode of operation. As part of the control loop of a buck-boost switching regulator, the current flowing in the inductor is sensed to adjust the duty cycle of the PWM control of the power switches. Conventional techniques for sensing the inductor current is not satisfactory because the sensing operation diverts the inductor current and also because the sensed current often is not an accurate representation of the actual inductor current.

SUMMARY OF THE INVENTION

According to one embodiment of the present invention, a current sense device for a power transistor is described. The power transistor is formed in a cellular structure including a cellular array of transistor cells where the cellular array includes a polysilicon layer formed in a mesh and having multiple substantially identical openings defining the source and drain regions, the source and drain regions being formed in alternate rows of the cellular array. The drain terminals of all transistor cells are electrically connected by first metal lines in a first metal layer and the source terminals of all transistor cells are electrically connected by second metal lines in the first metal layer and third metal lines in a second metal layer. The current sense device includes multiple transistor cells in the cellular array of transistor cells of the power transistor being used as sense transistor cells. The sense transistor cells are evenly distributed throughout the cellular array. The drain terminals of the sense transistor cells are electrically connected to the drain terminals of the transistor cells of the power transistor, the source terminal of each sense transistor cell is electrically connected to a first node through a fourth metal line in the first metal layer and through a fifth metal line in the second metal layer where the fourth and fifth metal lines are electrically isolated from the first, second and third metal lines in the respective first and second metal layers. The sense transistor cells measure a small portion of the current flowing through the power transistor based on the size ratio of the current sense device and the power transistor.

According to another aspect of the present invention, a current sensing circuit for a power switch in a buck-boost switching regulator is described. The switching regulator receives an input voltage and includes a controller circuit and a switch circuit coupled to generate a switching output voltage and an output circuit coupled to receive the switching output voltage and to supply current at a regulated output voltage to a load. The switch circuit includes a first power transistor having a source terminal coupled to the input voltage, a drain terminal coupled to a terminal of an inductor of the output circuit and a gate terminal being driven by a signal from the controller circuit. The current sensing circuit includes a current sense transistor being formed integrally embedded in the first power transistor for sensing a current flowing through the first power transistor where the current sense transistor has a gate terminal coupled to the gate terminal of the first power transistor, a drain terminal coupled to the drain terminal of the first power transistor, and a source terminal coupled to a first node. the current sensing circuit further includes a sense resistor being coupled between the input voltage and the first node where a sense voltage is developed at the first node as a result of the sensed current, a reference current source for providing a reference current being temperature compensated, a reference resistor coupled between the input voltage and the reference current source where a reference voltage is developed at a node between the reference resistor and the reference current source, and a comparator circuit comparing the sense voltage and the reference voltage. The comparator circuit generates a comparison output voltage having a first value when the sense voltage exceeds the reference voltage. The comparison output voltage is used by the controller circuit to adjust the duty cycle of the switching output voltage.

The present invention is better understood upon consideration of the detailed description below and the accompanying drawings.

DETAILED DESCRIPTION OF THE PREFERRED EMBODIMENTS

In accordance with the principles of the present invention, a current sense device is integrally embedded in the PMOS power switch of a buck-boost switching regulator to sense the current flowing through the inductor of the switching regulator. Moreover, the sense device returns the sensed current to the drain of the PMOS power switch to flow to the inductor so that no inductor current is diverted by the current sense process. The sense device is integrally embedded in the PMOS power switch by scattering small PMOS sense transistors throughout the parallelly connected PMOS transistors forming the PMOS power switch. The sense device thus has the same distributed structure as the PMOS power switch and the large number of small sense transistors scattered throughout the power PMOS switch realizes error averaging, thereby improving the sensing accuracy.

More specifically, the power switch of a switching regulator is typically formed using a cellular array structure. That is, the power switch is formed by a large number of PMOS transistor cells formed in an array and connected in parallel. In accordance with the present invention, the sense device includes PMOS sense transistors that are embedded in the cellular array of the power transistor cells. Thus, the PMOS sense transistors of the sense device are distributed throughout the cellular array of the PMOS power switch. The PMOS sense transistors have their source terminal connected to a resistor for measuring the current flowing through the PMOS sense transistors, thereby measuring the current flowing through the power switch. The PMOS sense transistors are configured so that the sensed current is returned to the drain terminal of the sense transistors and onto the inductor so that no current is diverted for current sensing.

In accordance with the present invention, the current measured by the sense device is ratioed to the total current via the embedded sense transistors to ensure accurate correlation. Furthermore, the measured current is dependent upon ratioed resistors and a reference current that is a function of a bandgap regulator. Thus, the measured current is temperature compensated. Finally, the total area required to implement the sense device of the present invention is smaller than conventional techniques, thereby reducing the manufacturing cost of the buck-boost switching regulator.

Figure 1:
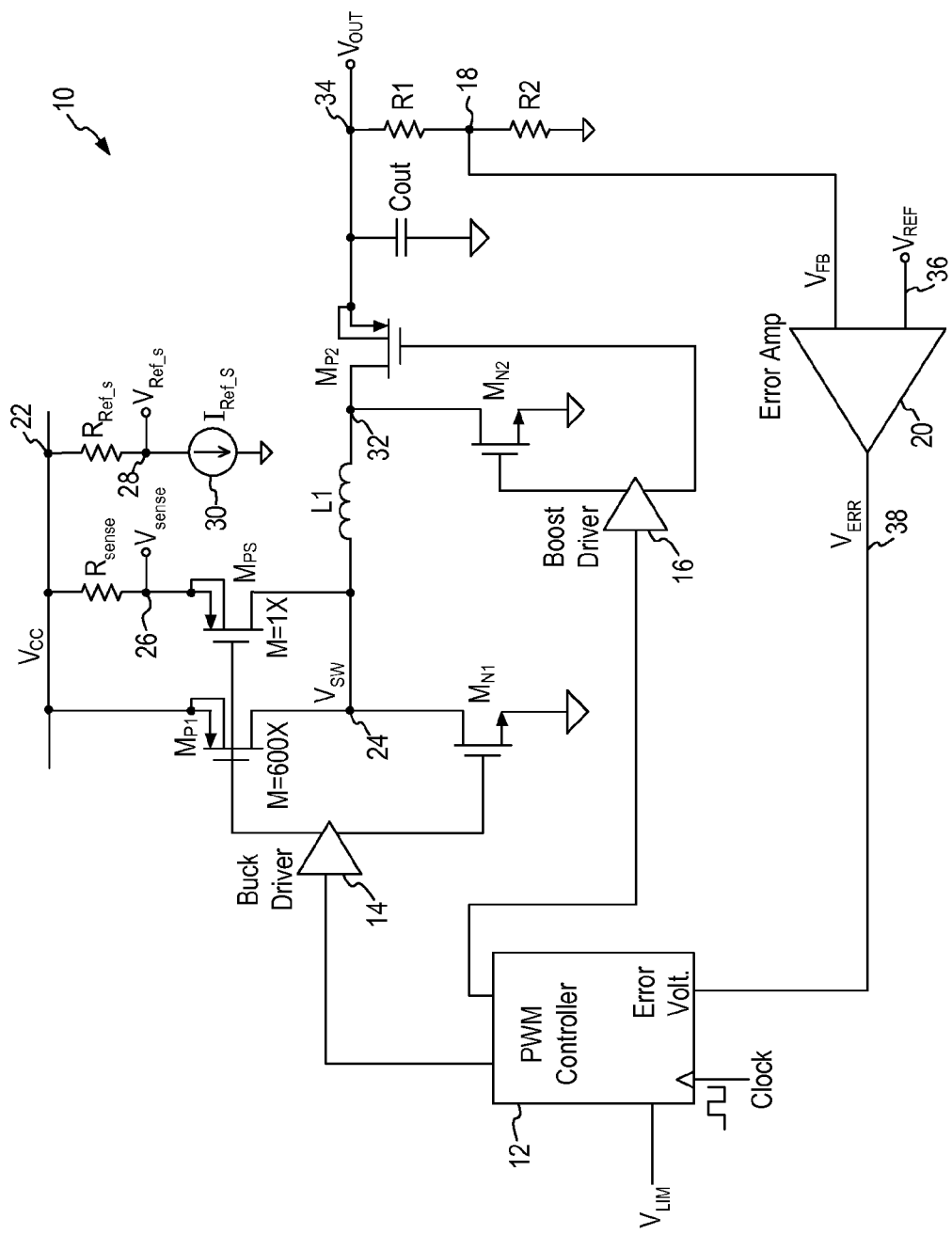
FIG. 1 is a schematic diagram of a buck-boost switching regulator according to one embodiment of the present invention.

FIG. 1 is a schematic diagram of a buck-boost switching regulator according to one embodiment of the present invention. Referring to FIG. 1, a buck-boost switching regulator 10 includes a PWM controller circuit 12, power switches $M_{N1}$ and $M_{P1}$ for buck operation and power switches $M_{N2}$ and $M_{P2}$ for boost operation, an inductor L1, and an output capacitor $C_{OUT}$. The buck-boost switching regulator 10 receives an input voltage being the power supply $V_{CC}$ voltage on a node 22 and provides an output voltage $V_{OUT}$ having a substantially constant magnitude on a node 34 for driving a load (not shown). A voltage divider circuit including resistors R1 and R2 divides down the output voltage $V_{OUT}$ to provide a feedback voltage $V_{FB}$ (on node 18) to be fed back to the PWM controller circuit 12 to provide regulation and control of the output voltage. PWM controller circuit 12 also receives an input clock signal and a current limit signal $V_{LIM}$, to be described in more detail below.

More specifically, buck-boost switching regulator 10 includes an error amplifier 20 for receiving the feedback voltage $V_{FB}$ and a reference voltage $V_{REF}$ and providing an error output voltage $V_{ERR}$ on a node 38 responsive to the difference between the feedback voltage and the reference voltage. The error output voltage $V_{ERR}$ is processed by the PWM controller circuit 12 to derive the control signals for driving the power switches in either the buck mode or the boost mode of operation. Error output voltage $V_{ERR}$ controls the duty cycle of the power switches in either the buck mode or the boost mode of operation. In the present illustration, PWM controller circuit 12 generates control signals for controlling a buck driver circuit 14 for driving NMOS power transistor $M_{N1}$ and PMOS power transistor $M_{P1}$ as the buck power switches. PWM controller circuit 12 also generates control signals for controlling a boost driver circuit 16 for driving NMOS power transistor $M_{N2}$ and PMOS power transistor $M_{P2}$ as the boost power switches.

PMOS power switch $M_{P1}$, having a gate terminal driven by the buck driver 14, has a source terminal connected to the input voltage $V_{CC}$ (node 22) and a drain terminal coupled to provide a switching output voltage $V_{SW}$ on a node 24. NOMS power switch $M_{N1}$, having a gate terminal driven by the buck driver 14, has a source terminal connected to the ground voltage and a drain terminal coupled to the switching output voltage $V_{SW}$ node 24.

Inductor L1 is coupled between the switching output voltage $V_{SW}$ (node 24) and the drain terminals of the boost power switches (node 32). PMOS power switch $M_{P2}$, having a gate terminal driven by the boost driver 16, has a drain terminal coupled to inductor L1 (node 32) and a source terminal providing the regulated output voltage $V_{OUT}$ (node 34). NOMS power switch $M_{N2}$, having a gate terminal driven by the boost driver 16, has a source terminal connected to the ground voltage and a drain terminal coupled to inductor L1 (node 32).

In the present embodiment, a PMOS sense device $M_{PS}$ is connected in the parallel current path as the PMOS power switch $M_{P1}$ to sense the output current level. The sensed current is measured by a sense resistor $R_{sense}$ connected between the input voltage $V_{CC}$ and the source terminal of the PMOS sense device $M_{PS}$. A voltage $V_{sense}$ is thus developed at a node 26 indicative of the current flowing through power switch $M_{P1}$ and inductor L1.

The basic operation of buck-boost switching regulator 10 for providing a regulated output voltage $V_{OUT}$ having a substantially constant magnitude is as follows. PWM controller circuit 12 selects the buck or boost mode of operation depending on the input voltage $V_{CC}$ and the desired regulated output voltage $V_{OUT}$. When the buck mode is selected, the boost PMOS power transistor $M_{P2}$ is left on, and the boost NMOS power transistor $M_{N2}$ is left off. The boost transistors thus have no effect on the buck mode of operation. The buck power transistors $M_{P1}$ and $M_{N1}$ are then synchronously switched by the pulses from PWM controller circuit 12 at a duty cycle to regulate the output voltage to be a predetermined level. In the buck mode, PWM controller circuit 12 drives the power switch $M_{P1}$ to turn on so that inductor L1 has the input voltage $V_{CC}$ impressed upon it and the current through the inductor builds up. At the end of the duty cycle, the PWM controller circuit 12 turns off power switch $M_{P1}$ and turns on power switch $M_{N1}$. The voltage across inductor L1 reverses and inductor L1 dumps energy through power switch $M_{P2}$ onto output capacitor $C_{OUT}$.

When the boost mode is selected, the buck PMOS power transistor $M_{P1}$ is left on, and the buck NMOS power transistor $M_{N1}$ is left off. The buck power transistors thus have no effect on the boost mode of operation. The boost power transistors $M_{P2}$ and $M_{N2}$ are then synchronously switched by the pulses from the PWM controller circuit 12 at a duty cycle to regulate the output voltage to be a predetermined level. In the boost mode, PWM controller circuit 12 drives the power switch $M_{P2}$ to turn on so that the current from the input voltage $V_{CC}$ flows through the inductor L1 and power switch $M_{P2}$ to charge up output capacitor $C_{OUT}$. At the end of the duty cycle, the PWM controller circuit 12 turns off power switch $M_{P2}$ and turns on power switch $M_{N2}$, thereby directing the inductor current to ground. The output voltage $V_{OUT}$ is maintained by output capacitor $C_{OUT}$ until the next cycle when power switch MP2 is turned on again.

Buck-boost switching regulator 10 uses PMOS sense device $M_{PS}$ for sensing the current flowing through power transistor $M_{P1}$ and inductor L1. In the present embodiment, PMOS sense device $M_{PS}$ has a size 1/600 times the size of PMOS power transistor $M_{P1}$ and thus PMOS sense device $M_{PS}$ senses a portion of the source current flowing through PMOS power transistor $M_{P1}$. In general, the sense device $M_{PS}$ has a size 1/X times the size of PMOS power transistor $M_{P1}$ where X is greater than 100. The sensed current is converted to a sense voltage $V_{sense}$ by a resistor $R_{sense}$. The sense voltage is compared to a reference voltage $V_{Ref\_s}$ which is generated by flowing a reference current $I_{Ref\_s}$ through an identical resistor $R_{Ref\_s}$. In one embodiment, resistors Rsense and $R_{Ref\_s}$ are formed as arrays of resistors. The generation of the reference current $I_{Ref\_s}$ and the reference voltage $V_{Ref\_s}$ and the comparator circuit will be described in more detail below.

Figure 2:
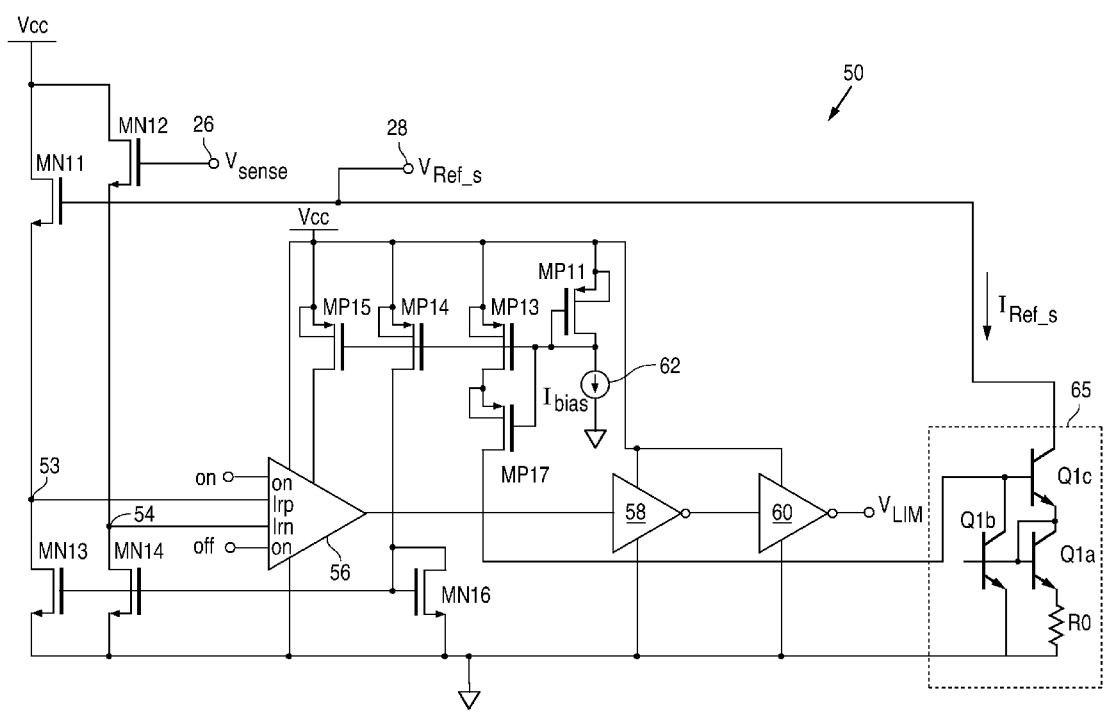
FIG. 2 is a schematic diagram of a comparator circuit which can be incorporated in buck-boost switching regulator of FIG. 1 according to one embodiment of the present invention.

Buck-boost switching regulator 10 includes a comparator circuit for comparing the sense voltage to the reference voltage. Furthermore, the comparator circuit includes a temperature compensation circuit for the reference voltage so as to improve the accuracy of the sense voltage comparison. FIG. 2 is a schematic diagram of a comparator circuit which can be incorporated in buck-boost switching regulator of FIG. 1 according to one embodiment of the present invention. Referring to FIG. 2, comparator circuit 50 receives the sense voltage $V_{sense}$ on node 26 and the reference voltage $V_{Ref\_s}$ on node 28 for comparison and generates a comparison output voltage $V_{LIM}$ indicating when the sense voltage $V_{sense}$ exceeds the reference voltage.

Comparator 50 includes a differential amplifier formed by NMOS transistors MN11, MN12, MN13 and MN14 for receiving the sense voltage $V_{sense}$ and the reference voltage $V_{Ref\_s}$ and generating differential output voltages on output nodes 53 and 54 indicative of the difference between the sense voltage $V_{sense}$ and the reference voltage $V_{Ref\_s}$. The differential output voltages from the differential amplifier are coupled to respective positive and negative input terminals of a comparator 56. The output signal of comparator 56 on node 57 is coupled through two inverting buffers 58 and 60 to generate the comparison output signal $V_{LIM}$. The comparison output signal $V_{LIM}$ is coupled to the PWM controller circuit 12 (FIG. 1). When the sense voltage $V_{sense}$ is greater than the reference voltage $V_{Ref\_s}$, the comparison output signal $V_{LIM}$ is asserted and in response, the PWM controller circuit reduces the pulse width of the gate drive signals (reducing the duty cycle), thus reducing the current delivered to inductor L1.

In the present embodiment, comparator circuit 50 generates a temperature compensated reference current $I_{Ref\_s}$ for the reference resistor $R_{Ref\_s}$ so that the reference voltage $V_{Ref\_s}$ thus generated is temperature compensated and the accuracy of the comparison is improved. More specifically, comparator circuit 50 receives a bias current $I_{bias}$ (represented by current source 62). The bias current $I_{bias}$ is mirrored through PMOS transistor MP13 and a PMOS cascode transistor MP17 to a bandgap reference circuit 65. Bandgap reference circuit 65 is formed by NPN bipolar transistors Q1a and Q1b of unequal sizes and NPN bipolar transistor Q1c and a resistor R0. The collector terminal of transistor Q1c provides the temperature compensated reference current $I_{Ref\_s}$.

In comparator circuit 50, the bias current $I_{bias}$ is also mirrored by PMOS transistor MP14 and NMOS transistor MN16 to bias the differential amplifier and mirrored by PMOS transistor MP15 to bias comparator 56.

In one embodiment of the present invention, the sense device is integrally embedded in the power switch by scattering small PMOS sense transistors throughout the parallelly connected PMOS transistors forming the PMOS power switch. In this manner, PMOS sense transistors are strategically located within the overall PMOS power transistor array to achieve error averaging of the measured current. Furthermore, the measured sensed current is returned to the drain current flowing to the inductor L1 and is therefore not wasted.

Figure 3:
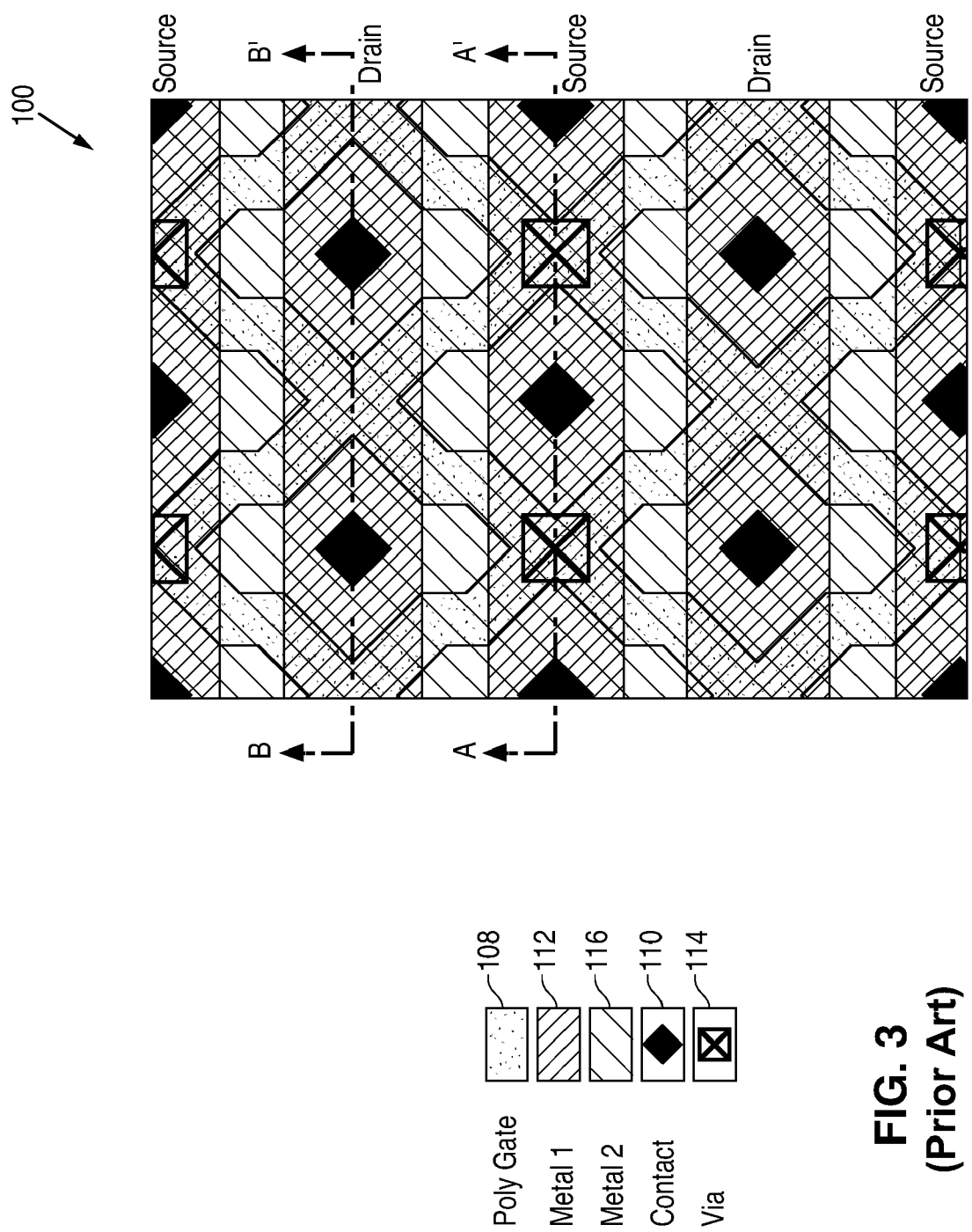
FIG. 3 is a top view of a portion of a cellular array of a conventional power transistor.

Power switches or power transistors are typically formed using a cellular transistor structure including a two-dimensional array of transistor cells connected in parallel. FIG. 3 is a top view of a portion of a cellular array of a conventional power transistor. Referring to FIG. 3, a power transistor 100 is formed by a two-dimensional array of transistors cells. The polysilicon layer 112 forming the gate terminal of the transistor cells resembles a mesh having a propeller shaped pattern openings. In other embodiments, openings with a diamond shaped pattern can also be used for the polysilicon layer. The power transistor 100 includes an array of cellular source regions 106 and drain regions 105. Source regions 106 and drain regions 105 are formed in alternate rows of the cellular structure. As a result, each source is surrounded by 4 one-fourth drains and each drain is surrounded by four one-fourth sources. The power transistor 100 thus has one drain for each source.

Metal contacts 110 are provided in each source and drain regions to make contact to the first metal layer (metal 1) 112. More specifically, the metal 1 layer 112 is formed in strips with each metal 1 strip connecting to the alternate rows of drain or source contacts. Vias 114 are formed on the source metal strips to make electrical connection to the second metal layer (metal 2) 116. In the present embodiment, the metal 2 layer 116 carries the input voltage $V_{CC}$ and thus is only connected to the source of the PMOS transistor cells. Vias 114 are thus formed only on the metal strips of the source regions and not of the drain regions.

Figure 4:
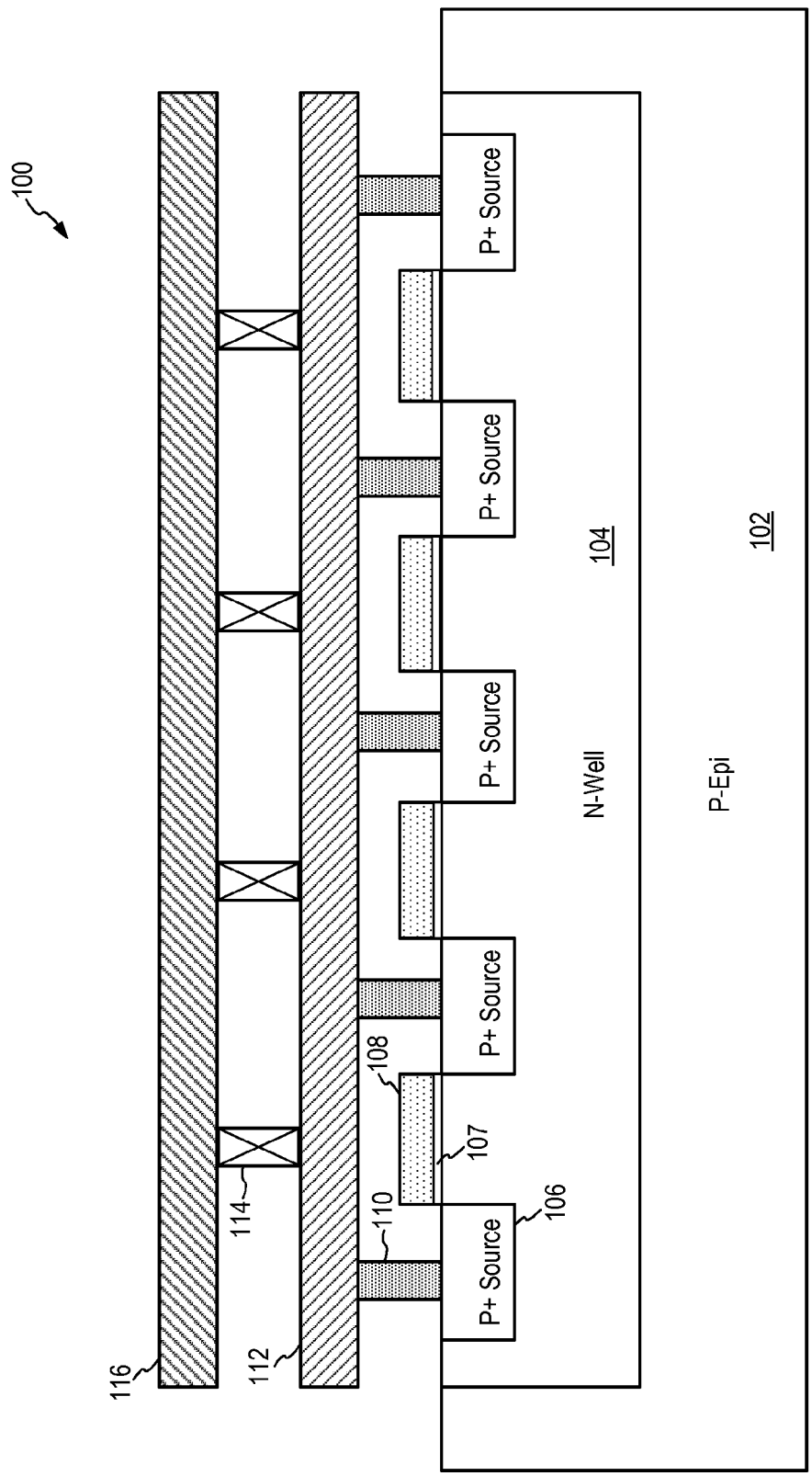
FIG. 4 is a cross-sectional view of a portion of the cellular array of the power transistor of FIG. 3 along the line A-A'.

FIG. 4 is a cross-sectional view of a portion of the cellular array of the power transistor of FIG. 3 along the line A-A'. The cross-sectional view of FIG. 4 shows the source regions and source contacts that are formed on the same row in the cellular array. Referring to FIG. 4, power transistor 100 is formed in an N-well 104 formed on a p-type epitaxial layer 102 on a semiconductor substrate (not shown). Polysilicon layer 108 is formed on a gate oxide layer 107 to define the gate terminal of the PMOS transistors. P+ source regions 106 exist on either side of the gate terminal. Contacts 110 connect the P+ source regions 106 to the metal 1 layer 112. The metal 1 layer 112 is formed as a metal strip and connects all source contacts in the same row. Then, each metal 1 strip is then connected to the metal 2 layer 116 through vias 114. Thus, all the source contacts in the power transistor 100 are connected through the metal 1 layer on the same row and then through the metal 2 layer across the different rows. The metal 2 layer 116 is connected to the input voltage $V_{CC}$ so that the source terminals of all of the transistor cells are connected to the input voltage $V_{CC}$ to realize the electrical connection of power transistor $M_{P1}$ of FIG. 1.

Figure 5:
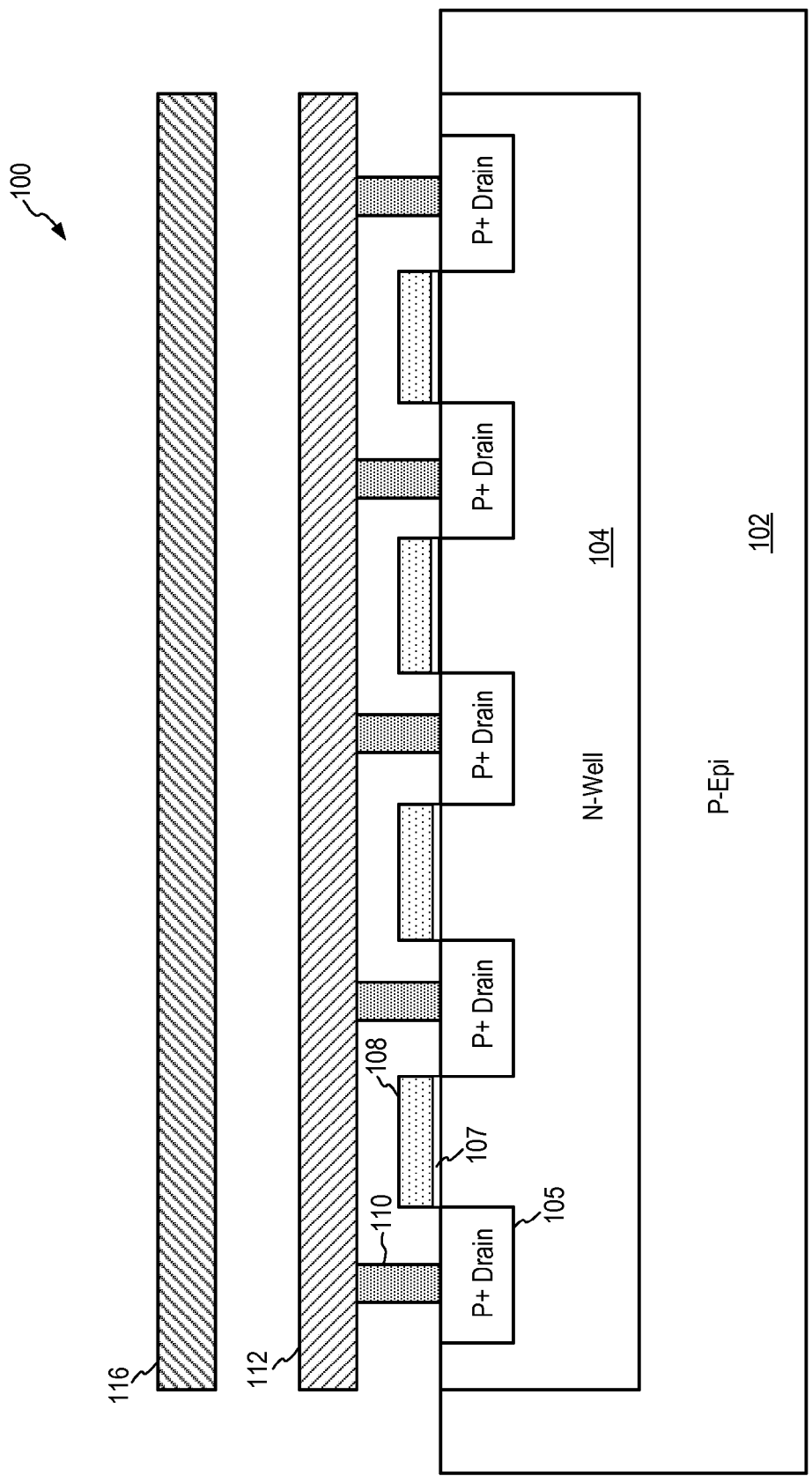
FIG. 5 is a cross-sectional view of a portion of the cellular array of the power transistor of FIG. 3 along the line B-B'.

FIG. 5 is a cross-sectional view of a portion of the cellular array of the power transistor of FIG. 3 along the line B-B'. The cross-sectional view of FIG. 5 shows the drain regions and drain contacts that are formed on the same row in the cellular array. Referring to FIG. 5, P+ drain regions 105 are formed on either side of the gate terminal formed by polysilicon layer 108 and the gate oxide layer 107. Contacts 110 connect the P+ drain regions 105 to the metal 1 layer 112. The metal 1 layer 112 is formed as a metal strip as shown in FIG. 3 connecting all the drain contacts in the same row. The metal 1 layer 112 eventually connects the drain contacts to one terminal of the inductor L1 (FIG. 1) so that current from the input voltage $V_{CC}$ flows through power transistor $M_{P1}$ onto the inductor.

Figure 6:
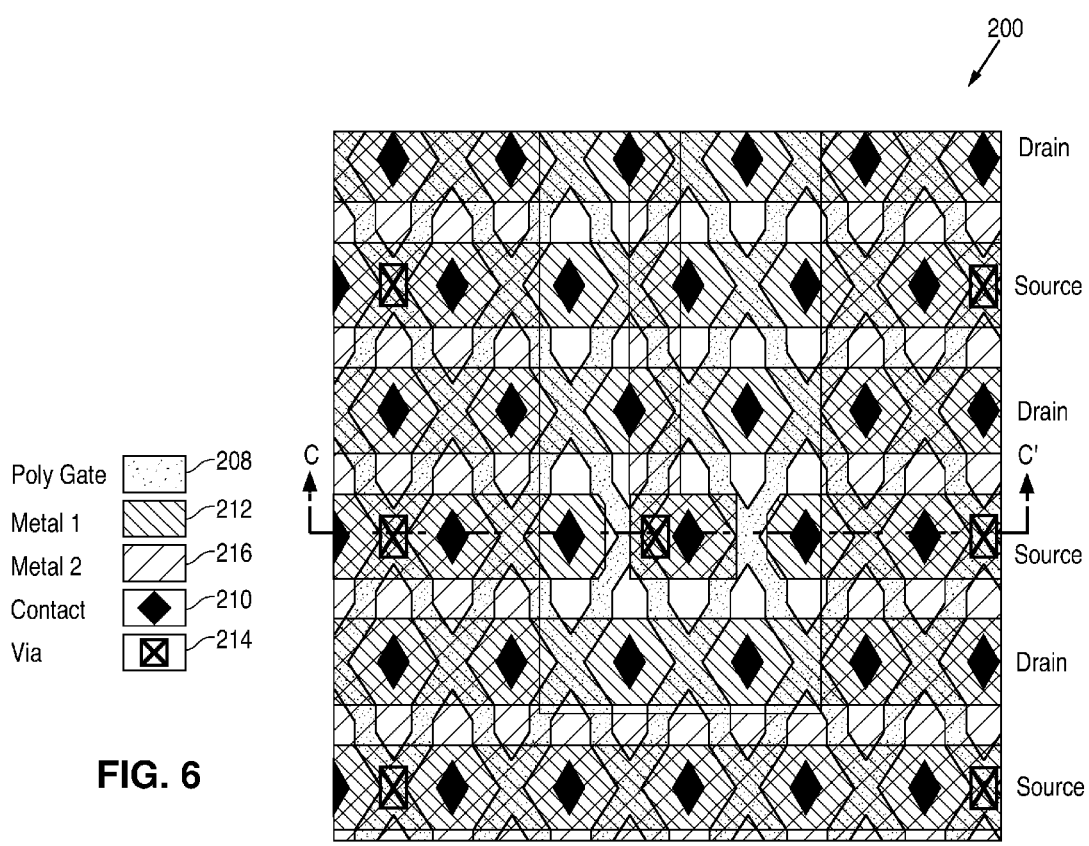
FIG. 6 is a top view of a portion of a cellular array of a power transistor incorporating an integrally embedded sense device according to one embodiment of the present invention.

Having described the conventional cellular array structure of a power transistor, a power transistor with an integrally embedded sense device will now be described with reference to FIG. 6. FIG. 6 is a top view of a portion of a cellular array of a power transistor incorporating an integrally embedded sense device according to one embodiment of the present invention. Referring to FIG. 6, a power transistor 200 is formed by a two-dimensional array of transistors cells. Power transistor 200 has the same basic transistor cell structure as power transistor 100. The polysilicon layer 212 forming the gate terminal of the transistor cells resembles a mesh with a propeller shaped pattern openings. In other embodiments, openings with a diamond shaped pattern can also be used for the polysilicon layer. The power transistor 200 includes an array of cellular source regions 206 and drain regions 205. Source regions 206 and drain regions 205 are formed in alternate rows of the cellular structure. As a result, each source is surrounded by 4 one-fourth drains and each drain is surrounded by four one-fourth sources. The power transistor 200 thus has one drain for each source.

Metal contacts 210 are provided in each source and drain regions to make contact to the first metal layer (metal 1) 212. More specifically, the metal 1 layer 212 is formed in strips with each metal 1 strip connecting to the alternate rows of drain or source contacts. Vias 214 are formed on the source metal strips to make an electrical connection to the second metal layer (metal 2) 216. In the present embodiment, the metal 2 layer 216 carries the input voltage $V_{CC}$ and thus is only connected to the source of the PMOS transistor cells. Vias 214 are thus formed only on the metal strips of the source regions and not of the drain regions.

In accordance with the present invention, a sense transistor cell 280 is formed in power transistor 200 using one of the transistor cells in the cellular array. Returning to FIG. 1, the PMOS sense transistor $M_{PS}$ has its drain terminal connected to the same node as the drain terminal of the power transistor $M_{P1}$ (node 24). However, the source terminal of the sense transistor $M_{PS}$ is not connected to the input voltage $V_{CC}$ but rather to the sense resistor $R_{sense}$. Returning back to FIG. 6, to realize the electrical connection of the sense transistor cell 280, the drain connections do not have to be altered but the source connection of sense transistor cell 280 needs to be redirected.

To that end, at the sense transistor cell 280, a break in the metal 1 strip is provided form an isolated metal 1 line 212A. Furthermore, a break in the metal 2 layer is provided to form a metal 2 line 216A separate from the metal 2 layer 216. Metal 2 line 216A connects the source region of sense transistor cell 280 to the resistor array (not shown). Metal 2 layer 216 remains connected to the source regions of the power transistor 200 through vias 214. At sense transistor cell 280, the source region is connected by contact 210A to metal 1 line 212A and then through via 214A to metal 2 line 216A. In this manner, the source region of the sense transistor cell is isolated from the source regions of the transistor cells forming the power transistor and an electrical connection to the source of the sense transistor is provided.

Figure 7:
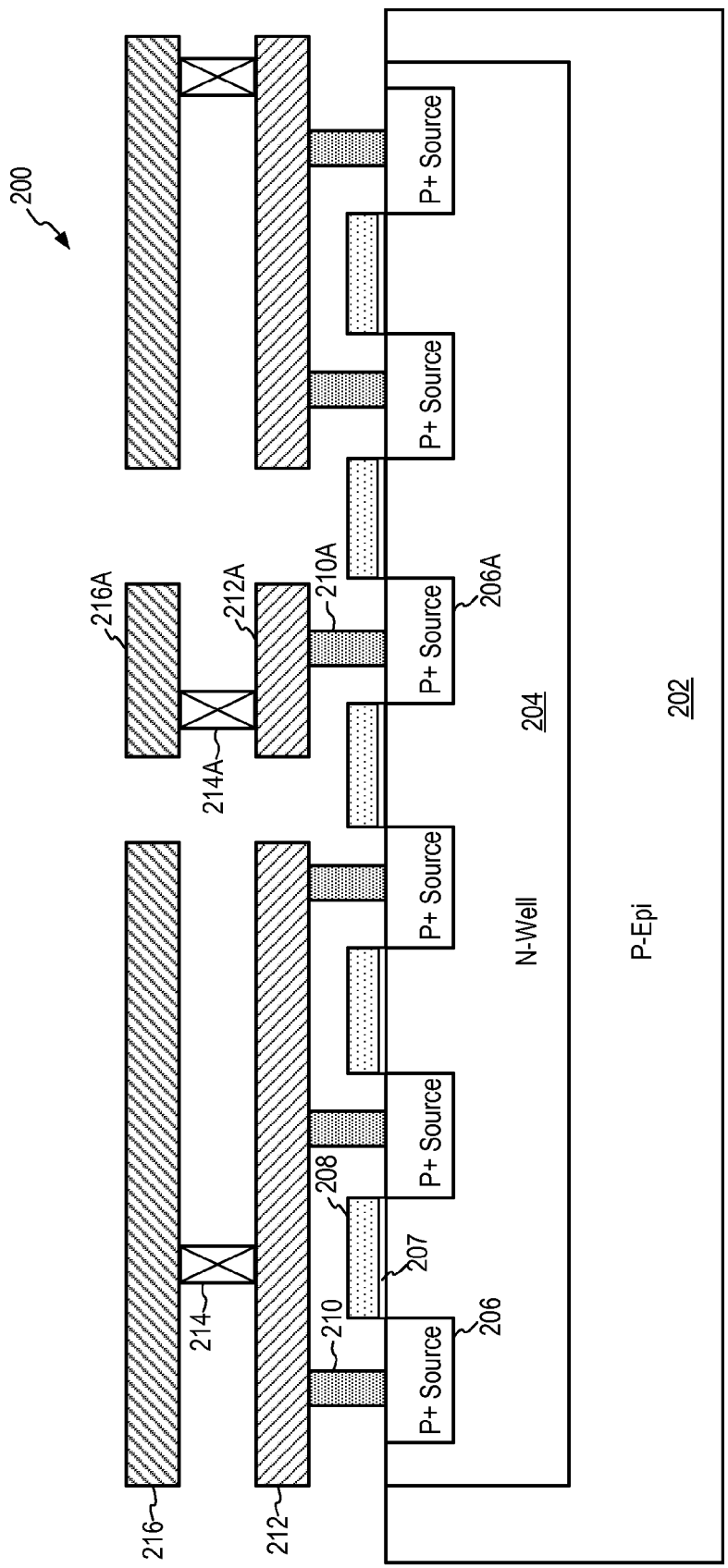
FIG. 7 is a cross-sectional view of a portion of the cellular array of the power transistor of FIG. 6 along the line C-C'.

FIG. 7 is a cross-sectional view of a portion of the cellular array of the power transistor of FIG. 6 along the line C-C'. The cross-sectional view of FIG. 7 illustrates the structure of the sense transistor cell relative to the transistor cells of the power transistor. Power transistor 200 has the same basic transistor cell structure as power transistor 100. Referring to FIG. 7, power transistor 200 is formed in an N-well 204 formed on a p-type epitaxial layer 202 on a semiconductor substrate (not shown). Polysilicon layer 208 is formed on a gate oxide layer 207 to define the gate terminal of the PMOS transistors. P+ source regions 206 exist on either side of the gate terminal. Contacts 210 connect the P+ source regions 206 to the metal 1 layer 212. The metal 1 layer 212 is formed as a metal strip and connects all source contacts in the same row, except for the source region 106A of the sense transistor cell 280. Then, each metal 1 strip is then connected to the metal 2 layer 216 through vias 214. Thus, all the source contacts in the power transistor 200 are connected through the metal 1 layer on the same row and then through the metal 2 layer across the different rows. The metal 2 layer 216 is connected to the input voltage $V_{CC}$ so that the source terminals of all of the transistor cells are connected to the input voltage $V_{CC}$ to realize the electrical connection of power transistor $M_{P1}$ of FIG. 1.

PMOS sense transistor cell 280 is formed using one of the transistor cells of power transistor 200. The P+ source region 206A of the sense transistor cell 280 is connected through metal contact 210A to metal 1 line 212A which is separated from metal 1 layer 212. Therefore, the source region 206A of sense transistor 280 does not connect to the input voltage $V_{CC}$. Rather, metal 1 line 212A is connected through via 214A to metal 2 line 216A. Metal 2 line 216A is separated from metal 2 layer 216. Metal 2 line 216A connects the source region of sense transistor 280 to the sense resistor (not shown).

Figure 8:
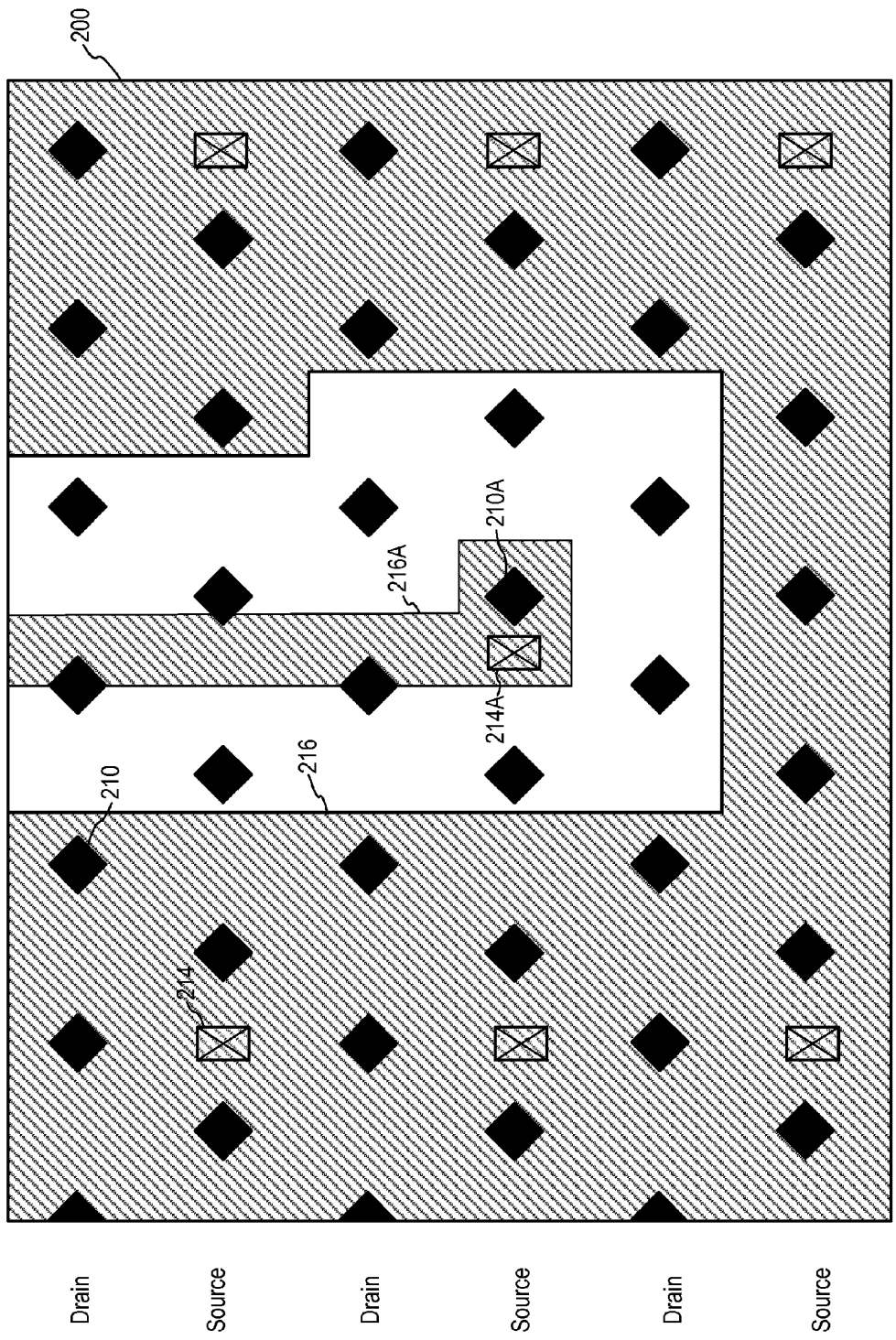
FIGS. 8-10 are top views at different levels of magnification of a power transistor incorporating the sense device according to one embodiment of the present invention.
Figure 9:
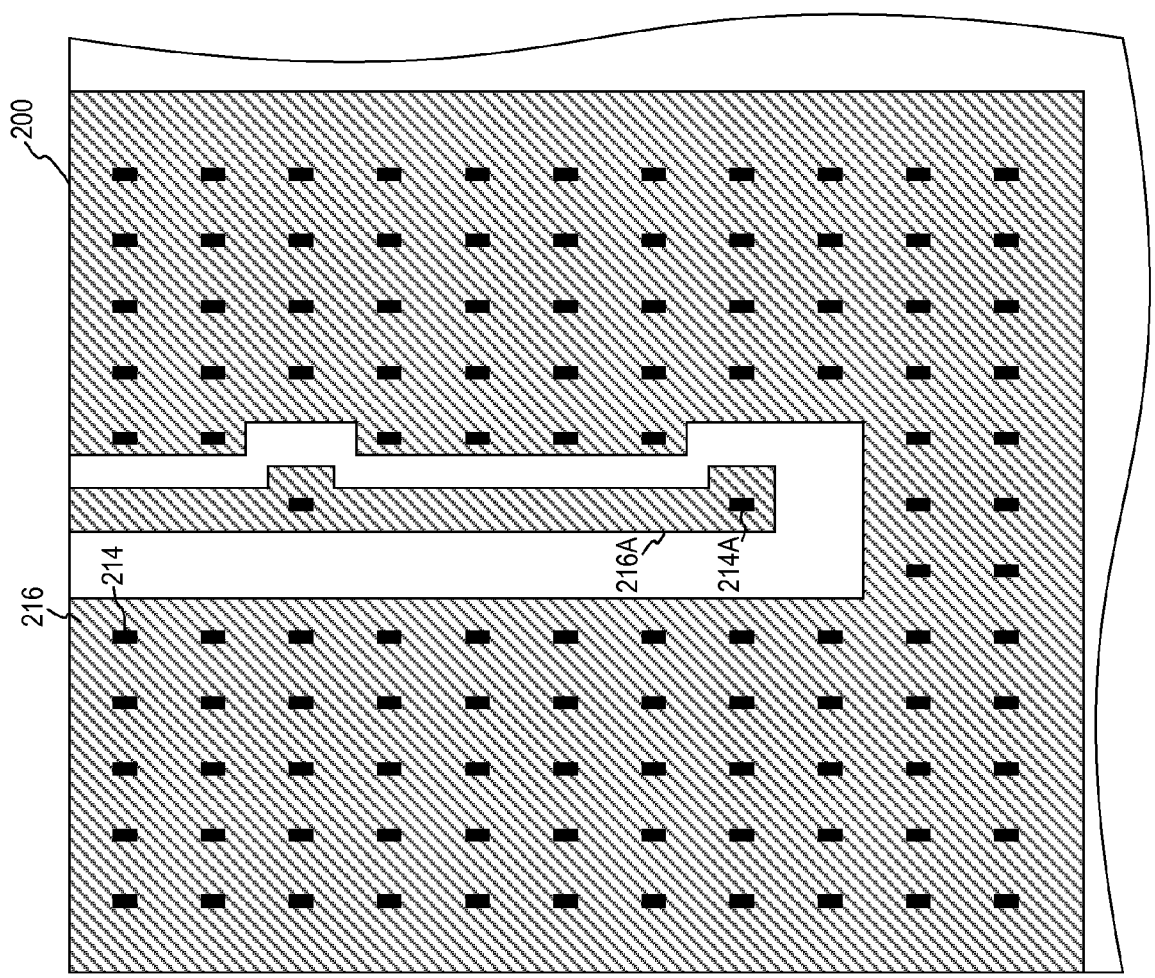
Figure 10:
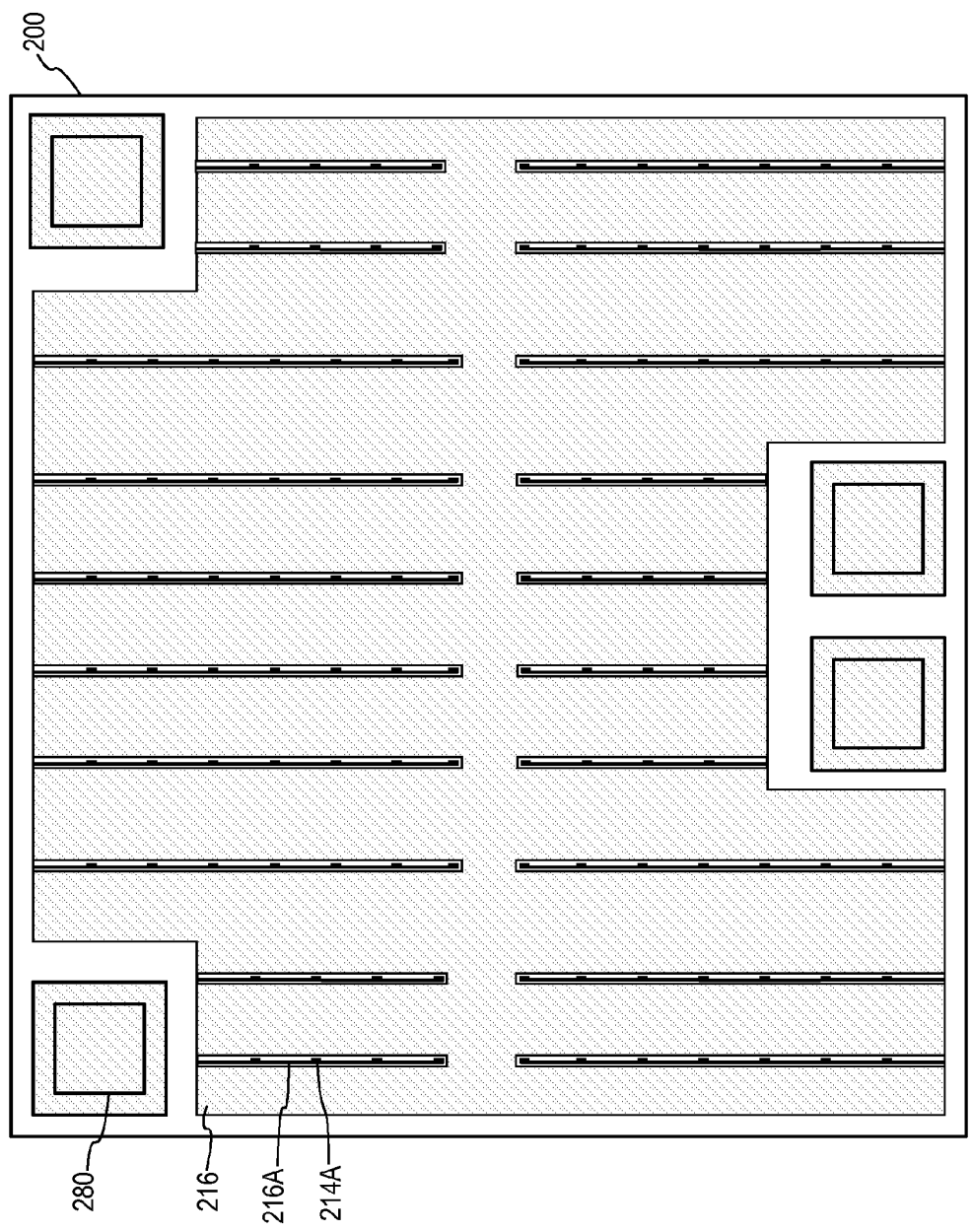

By using selected transistor cells of the power transistor 200 that are distributed evenly throughout the cellular array of the power transistor to form the sense transistor MPS, a sense device that is integrally embedded in power transistor 200 is realized. FIGS. 8-10 are top views at different levels of magnification of a power transistor incorporating the sense device according to one embodiment of the present invention. FIGS. 8-10 show only the contacts, vias and the metal 2 layer of the power transistor to better illustrate the integrally embedded nature of the sense device of the present invention.

Referring first to FIG. 8, the contacts 210 associated with the source and drain regions are formed in alternate rows. Vias 214 are formed on the metal 1 strips (not shown) of the source regions to connect the source regions to the metal 2 layer 216. A break in the metal 1 layer and the metal 2 layer is provided to allow the source region of the sense transistor cell 280 is to be separately connected. As shown in FIG. 8, contact 210A connects the source region of the sense transistor cell 280 to the metal 1 line and via 214A connects the metal 1 line to metal 2 line 216A.

Turning to FIG. 9, metal 2 line 216A is formed as a long metal line for connecting to other sense transistor cells in the cellular array. In FIG. 9, metal 2 line 216A connects two sense transistor cells. FIG. 10 illustrates an entire power transistor including bond pads 180 for connecting to the terminals of the power transistor. In power transistor 200 of FIG. 10, a predetermined number of transistor cells that are evenly distributed throughout the cellular array of power transistor 200 is selected to form the sense device. At each location, the metal 1 and metal 2 layers are broken up to allow electrically isolated metal 1 line and metal 2 line to be formed so as to route the source regions of the sense transistor cells to the sense resistor. As shown in FIG. 10, transistor cells that are scattered over the entire region of the cellular array have been selected to form the sense transistor. In this manner, the sense transistor is integrally embedded in the power transistor.

Because the sense transistor cells are a small portion of the transistor cells forming the power transistor, the current measured by the sense transistor is a small ratio of the total current of the power transistor.

In the above described embodiments, the sense device is integrally embedded into the power transistor by forming the sense device using the same transistor cells distributed or scattered throughout the power transistor. Other methods for integrally embedding the sense device in a power transistor is possible as long as the sense device is integrated in and evenly distributed throughout the power transistor structure rather than merely being formed adjacent the power transistor structure.

The above detailed descriptions are provided to illustrate specific embodiments of the present invention and are not intended to be limiting. Numerous modifications and variations within the scope of the present invention are possible. The present invention is defined by the appended claims.

We claim:

1. A current sense device for a power transistor, the power transistor being formed in a cellular structure including a cellular array of transistor cells, the cellular array comprising a polysilicon layer formed in a mesh and having a plurality of substantially identical openings defining the source and drain regions, the source and drain regions being formed in alternate rows of the cellular array, the drain terminals of all transistor cells being electrically connected by first metal lines in a first metal layer and the source terminals of all transistor cells being electrically connected by second metal lines in the first metal layer and third metal lines in a second metal layer, the current sense device comprising:

a plurality of transistor cells in the cellular array of transistor cells of the power transistor being used as sense transistor cells, the sense transistor cells being evenly distributed throughout the cellular array, the drain terminals of the sense transistor cells being electrically connected to the drain terminals of the transistor cells of the power transistor, the source terminal of each sense transistor cell being electrically connected to a first node through a fourth metal line in the first metal layer and through a fifth metal line in the second metal layer, the fourth and fifth metal lines being electrically isolated from the first, second and third metal lines in the respective first and second metal layers, wherein the sense transistor cells measure a small portion of the current flowing through the power transistor based on the size ratio of the current sense device and the power transistor.

2. The current sense device of claim 1, wherein the first node is coupled to one terminal of a resistor, the current measured by the sense transistor cells being converted to a voltage at the resistor.

3. The current sense device of claim 1, wherein the source terminal of each sense transistor cell is electrically connected to the fourth metal line in the first metal layer and the fourth metal lines for a group of sense transistor cells are connected to the fifth metal line in the second metal layer for connecting to the first node, the current sense device comprising a plurality of fifth metal lines for connecting to groups of fourth metal lines associated with groups of sense transistor cells.

4. The current sense device of claim 1, wherein the current sense device has a size 1/X times the size of the power transistor, X being greater than 100, for sensing 1/X times the current flowing through the power transistor.

5. A current sensing circuit for a power switch in a buck-boost switching regulator, the switching regulator receiving an input voltage and including a controller circuit and a switch circuit coupled to generate a switching output voltage and an output circuit coupled to receive the switching output voltage and to supply current at a regulated output voltage to a load, the switch circuit including a first power transistor having a source terminal coupled to the input voltage, a drain terminal coupled to a terminal of an inductor of the output circuit and a gate terminal being driven by a signal from the controller circuit, the current sensing circuit comprising:

a current sense transistor being formed integrally embedded in the first power transistor for sensing a current flowing through the first power transistor, the current sense transistor having a gate terminal coupled to the gate terminal of the first power transistor, a drain terminal coupled to the drain terminal of the first power transistor, and a source terminal coupled to a first node;

a sense resistor being coupled between the input voltage and the first node, a sense voltage being developed at the first node as a result of the sensed current;

a reference current source for providing a reference current being temperature compensated;

a reference resistor coupled between the input voltage and the reference current source, a reference voltage being developed at a node between the reference resistor and the reference current source; and a comparator circuit comparing the sense voltage and the reference voltage, the comparator circuit generating a comparison output voltage having a first value when the sense voltage exceeds the reference voltage, the comparison output voltage being used by the controller circuit to adjust the duty cycle of the switching output voltage.

6. The current sensing circuit of claim 5, wherein the current sense transistor has a size 1/X times the size of the first power transistor, X being greater than 100, for sensing 1/X times the current flowing through the first power transistor.

7. The current sensing circuit of claim 5, wherein the reference current source comprises a bandgap reference circuit generating a current inversely proportional to temperature.

8. The current sensing circuit of claim 5, wherein the first power transistor is formed in a cellular structure including a cellular array of transistor cells, the cellular array comprising a polysilicon layer formed in a mesh and having a plurality of substantially identical openings defining the source and drain regions, the source and drain regions being formed in alternate rows of the cellular array, the drain terminals of all transistor cells being electrically connected by first metal lines in a first metal layer and the source terminals of all transistor cells being electrically connected by second metal lines in the first metal layer and third metal lines in a second metal layer; and wherein the current sense transistor is integrally embedded in the first power transistor by being formed using a portion of the transistor cells in the cellular array of transistor cells of the first power transistor.

9. The current sensing circuit of claim 8, wherein the current sense transistor comprises:
a plurality of transistor cells in the cellular array of transistor cells of the first power transistor being used as sense transistor cells, the sense transistor cells being evenly distributed throughout the cellular array, the drain terminals of the sense transistor cells being electrically connected to the drain terminals of the transistor cells of the first power transistor, the source terminal of each sense transistor cell being electrically connected to a first node through a fourth metal line in the first metal layer and through a fifth metal line in the second metal layer, the fourth and fifth metal lines being electrically isolated from the first, second and third metal lines in the respective first and second metal layers,
wherein the sense transistor cells measure a small portion of the current flowing through the first power transistor based on the size ratio of the current sense transistor and the power transistor.

10. The current sensing circuit of claim 9, wherein the source terminal of each sense transistor cell is electrically connected to the fourth metal line in the first metal layer and the fourth metal lines for a group of sense transistor cells are connected to the fifth metal line in the second metal layer for connecting to the first node, the current sense device comprising a plurality of fifth metal lines for connecting to groups of fourth metal lines associated with groups of sense transistor cells.

* * * * *